United States Patent
Enriquez Shibayama et al.

(10) Patent No.: US 9,337,521 B2
(45) Date of Patent: May 10, 2016

(54) CROSSTALK REDUCTION IN SIGNAL LINES BY CROSSTALK INTRODUCTION

(71) Applicant: INTEL CORPORATION, Santa Clara, CA (US)

(72) Inventors: Raul Enriquez Shibayama, Zapopan (MX); Maria Garcia Garcia de Leon, Zapopan (MX); Kai Xiao, University Place, WA (US); Beom-Taek Lee, Mountain View, CA (US); Carlos Lizalde Moreno, Guadalajara (MX)

(73) Assignee: Intel Corporation, Santa Clara, CA (US)

( * ) Notice: Subject to any disclaimer, the term of this patent is extended or adjusted under 35 U.S.C. 154(b) by 57 days.

(21) Appl. No.: 14/080,013

(22) Filed: Nov. 14, 2013

(65) Prior Publication Data

US 2015/0130553 A1 May 14, 2015

(51) Int. Cl.
*H04B 3/32* (2006.01)
*H01P 3/02* (2006.01)
*H05K 1/02* (2006.01)
*H05K 1/11* (2006.01)
*H01P 5/02* (2006.01)

(52) U.S. Cl.
CPC ........ *H01P 3/026* (2013.01); *H04B 3/32* (2013.01); *H05K 1/0228* (2013.01); *H01P 5/028* (2013.01); *H05K 1/0225* (2013.01); *H05K 1/0239* (2013.01); *H05K 1/0245* (2013.01); *H05K 1/117* (2013.01); *H05K 2201/09672* (2013.01); *Y10T 29/49117* (2015.01)

(58) Field of Classification Search
CPC .............. H05K 1/0228; H05K 1/0216; H05K 2201/09245; H05K 1/0225; H05K 1/0239; H05K 1/0245; H05K 1/117; H05K 2201/09672; H01P 3/088; H01P 3/026; H01P 5/028; H04B 3/32; Y10T 29/49117
USPC ................................... 333/1, 5, 12
See application file for complete search history.

(56) References Cited

U.S. PATENT DOCUMENTS

| | | | |
|---|---|---|---|
| 5,414,393 A * | 5/1995 | Rose et al. | ........................ 333/1 |
| 6,379,157 B1 | 4/2002 | Curry et al. | |
| 2008/0232233 A1* | 9/2008 | Spirkl et al. | .................. 370/201 |

FOREIGN PATENT DOCUMENTS

GB  2380334 A  4/2003

* cited by examiner

*Primary Examiner* — Barbara Summons
(74) *Attorney, Agent, or Firm* — International IP Law Group, P.L.L.C.

(57) ABSTRACT

A circuit component is described herein. The circuit component includes a first signal line to propagate in a first direction and a second signal line to propagate a second direction. The circuit component includes a region to introduce crosstalk within the region that reduces another crosstalk generated at a location remote from the region based on a change in propagation direction of the first signal line and second signal line.

17 Claims, 5 Drawing Sheets

300

CROSSTALK REDUCTION IN SIGNAL LINES BY CROSSTALK INTRODUCTION

TECHNICAL FIELD

This disclosure relates generally to techniques for reducing far-end crosstalk in signaling. Specifically, this disclosure relates to reducing far-end crosstalk by introducing crosstalk as a result of a change in propagation direction within signal lines of a circuit component.

BACKGROUND ART

Computing systems may include devices such as a motherboard, a printed circuit board (PCB), an edge connector, packaging technology such as a land grid array (LGA), a pin grid array (PGA), and the like. Each device may include one or more circuit components. A circuit component may include signal lines connecting one device to another device. In some circuit components, crosstalk between signal lines may interfere with signal communication. Crosstalk reduction mechanisms aim at reducing crosstalk to improve signal communication in terms of signal strength and quality, for example.

BRIEF DESCRIPTION OF THE DRAWINGS

The same numbers are used throughout the disclosure and the figures to reference like components and features. Numbers in the 100 series refer to features originally found in FIG. 1; numbers in the 200 series refer to features originally found in FIG. 2; and so on.

DESCRIPTION OF THE EMBODIMENTS

The present disclosure relates generally to techniques for reducing crosstalk between signal lines in circuit components. A circuit component, as referred to herein, is portion of a circuit that propagates signals within the circuit. Example circuit components may include interconnect components such as an edge connector, socket, routing, and the like. A signal line may include a single-ended signal line or a pair of conductors that form a differential signal line pair. Crosstalk may be generated by inductive and capacitive coupling between two adjacent signal lines. Crosstalk occurring at the beginning of a signal line, such as at an input to a given signal line may be referred to herein as global near end crosstalk (global NEXT). Crosstalk occurring at the end of a signal line, such as at an output to a given signal line may be referred to herein as global far end crosstalk (global FEXT).

The embodiments described herein include a region wherein local near end crosstalk (local NEXT) is introduced within the region such that global FEXT is reduced at the output of two signal lines within a circuit component. In embodiments, the global FEXT is reduced by overlapping the signal lines within the region such that the propagation direction of the signal lines is opposite to one another, thereby introducing local NEXT crosstalk configured to reduce, and even cancel global FEXT at the output of the signal lines.

Figure 1:
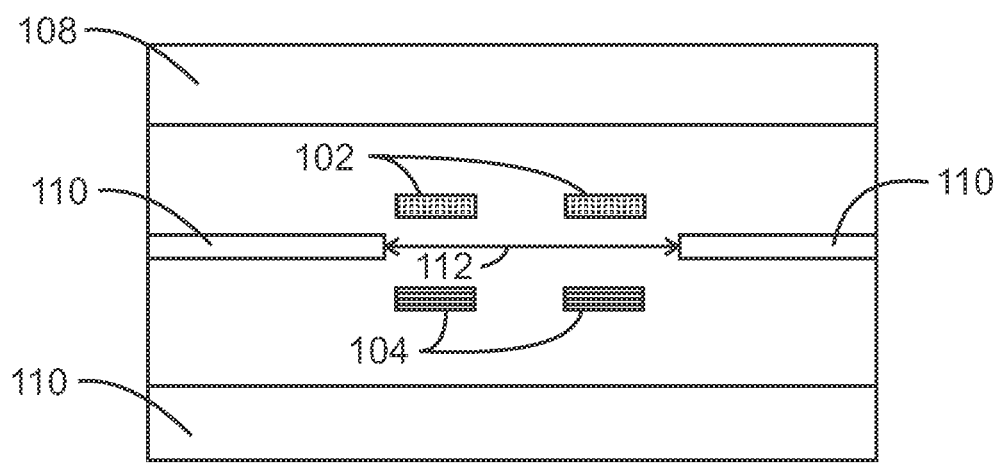
FIG. 1 is a block diagram illustrating a cross-sectional of one section of a circuit component.

FIG. 1 is a block diagram illustrating a cross-sectional view of one section of a circuit component or circuit package. As illustrated in FIG. 1, the circuit component or circuit package 100 may include differential signal lines. A first signal line pair 102 and a second signal line pair 104 may be positioned between conductive planes 106 and 108. In some embodiments, a reference plane 110 may be disposed between the first signal line pair 102 and the second signal line pair 104. As illustrated in FIG. 1, the reference plane 110 may define a region 112 between the first signal line pair 102 and the second signal line pair 104 wherein crosstalk is introduced between the signal line pairs. The crosstalk introduced in the region 112 may be local NEXT. The region 112 enables crosstalk generated at locations remote from the region 112 to be reduced by crosstalk introduced within the region 112. As discussed in more detail below, the introduction of crosstalk is dependent upon the signal line pairs 102, 104 propagating in opposite directions within the region 112.

In some embodiments, the circuit component 100 does not include the reference plane 110. Instead, the region is defined as void within a material of the circuit component 100, such as a void in a dielectric material disposed between the first signal line pair 102 and the second signal line pair 104 in areas remote from the region 112. In other words, the reference plane 110 may be omitted from the circuit component 100 as a long as the region 112 is defined within the circuit component 100 such that signal lines propagate in opposite directions with respect to one another within the region.

Figure 2:
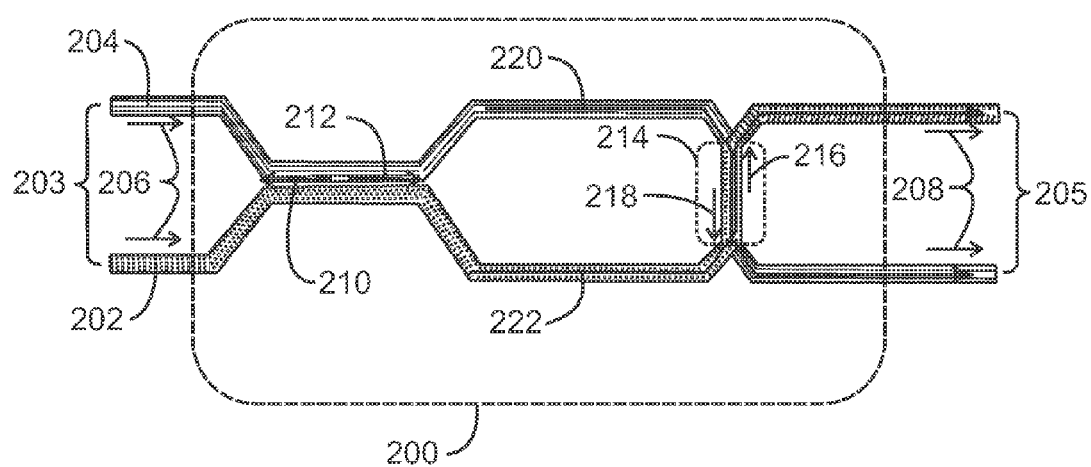
FIG. 2 is a diagram illustrating a top view of signal lines of a circuit component.

FIG. 2 is a diagram illustrating a top view of signal lines of a circuit component. The circuit component, indicated by the dashed box 200, includes a victim signal line 202 and an aggressor signal line 204 propagating through the circuit component 200. It is noted that the signal lines 202 and 204 illustrated in FIG. 2 are single ended rather than differential signal pairs such as the signal line pairs 102 and 104 discussed above in reference to FIG. 1. However, differential signal line pairs may be implemented using the techniques discussed herein to reduce crosstalk without restriction.

The victim signal line 202 is a victim as it receives crosstalk from the aggressor signal line 204. In embodiments, either signal line 202 or 204, may be both a victim and an aggressor, but for purposes of the description herein, the signal line 202 is referred to herein as the victim signal line 202 and the signal line 204 is referred to herein as the aggressor signal line 204. The victim signal line 202 and the aggressor signal line 204 propagate in the same direction as indicated by the arrows 206 at an input 203, as well as propagate in the same direction at an output 205 as indicated by the arrows 208. In embodiments, crosstalk may be generated wherein the aggressor signal line 204 couples with the victim signal line 202, resulting in global NEXT propagating in a direction towards the input, as indicated by the arrow 210 (referred to herein as global NEXT 210), and global FEXT propagating in a direction towards the output as indicated by the arrow 212 (referred herein to as global FEXT 212). When left unreduced, the global FEXT 212 may create signal interference that is undesired between the victim signal line 202 and the aggressor signal line 204.

The techniques described herein introduce crosstalk within a region, indicated by dashed box 214, of opposite signal propagation to reduce global FEXT 212 generated remotely from the region 214. In some embodiments, the region 214 may be defined by an opening in a reference plane between signal lines, such as the opening in the reference plane 110 discussed above in reference to FIG. 1. The crosstalk introduced within the region 214 may propagate in two directions depending on the type of crosstalk introduced. As illustrated in FIG. 2, local NEXT 216 propagating in a direction opposite to a direction 220 of the aggressor signal line 204, and local FEXT 218 propagating in a direction similar to the direction 220 of the aggressor signal line 204 may be introduced within the region 214.

The local NEXT 216 introduced within the region 214 may result in counterbalance of global FEXT at the output 208 and may reduce the global FEXT 212. The difference in propagation direction between the local NEXT 216 and the direction 220 of the aggressor signal line 204 is implemented by overlapping the aggressor signal line 204 and the victim signal line 202 within the region 216. As illustrated in FIG. 2, the overlap within the region 216 is such that the direction 220 is opposite to a direction of propagation 222 within the region 214, and consequently the propagation direction of local NEXT 216 generated within the region 214.

In embodiments, the local NEXT 216 introduced within the region 214 may be based on the addition of inductive coupling and capacitive coupling. Specifically, the amount, or amplitude, of inductive coupling may be based on an inductance ratio of mutual inductance to self-inductance. Likewise, the amount, or amplitude, of capacitive coupling may be based on a capacitance ratio of mutual capacitance to self-capacitance. The local NEXT 216 is proportional to the addition, rather than the subtraction, of the inductance ratio to the capacitance ratio. In contrast, local FEXT 218 is proportional to the subtraction of the capacitance ratio from the inductance ratio. The proportionality of local NEXT 216 to the addition of the inductance and capacitance ratios enables a relatively higher amount of crosstalk to be introduced into the region 214, relative to the introduction of local FEXT 218. The higher amount of crosstalk introduced by local NEXT 216 may be used to reduce crosstalk, such as the global FEXT 212, even when the inductive and capacitive crosstalk ratios are not closely balanced. Therefore, the introduction of local NEXT 216 may be configured to reduce FEXT 212 even when the inductive and capacitive coupling ratios are not the same.

Figure 3:
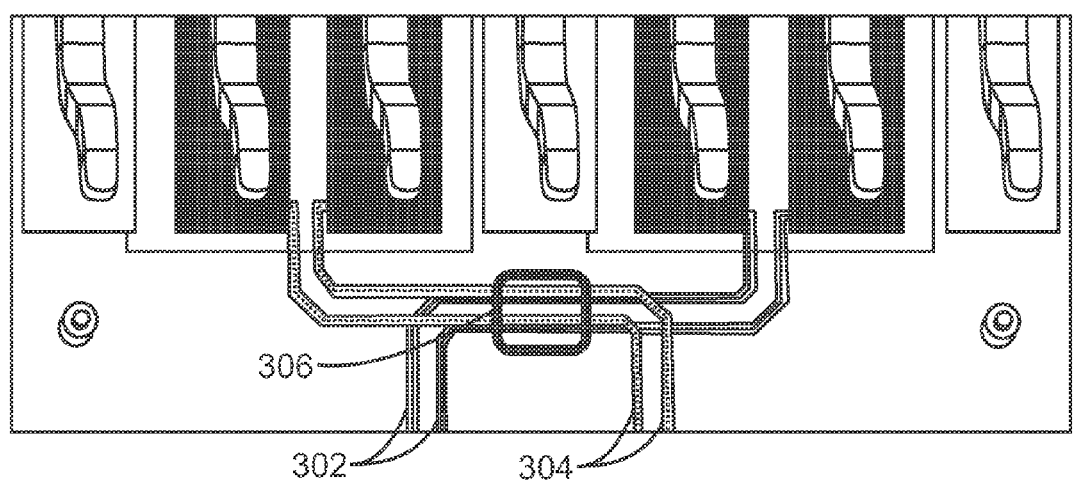
FIG. 3 illustrates the crosstalk reduction mechanism implemented in a portion of an edge connector.

FIG. 3 illustrates the crosstalk reduction mechanism implemented in a portion of an edge connector. As discussed above, a circuit component may be one of several different components including an edge connector. A portion 300 of the edge connector may be connected to signal lines 302 and 304 configured to overlap in a region 306 such that the direction of propagation relative to each signal line is opposite to each other within the region 306. As illustrated in FIG. 3, the crosstalk reduction mechanism implemented by opposite propagation directions within the region 306 may reduce global FEXT without adding additional metallic structures or isolation pins to otherwise reduce crosstalk.

Figure 4:
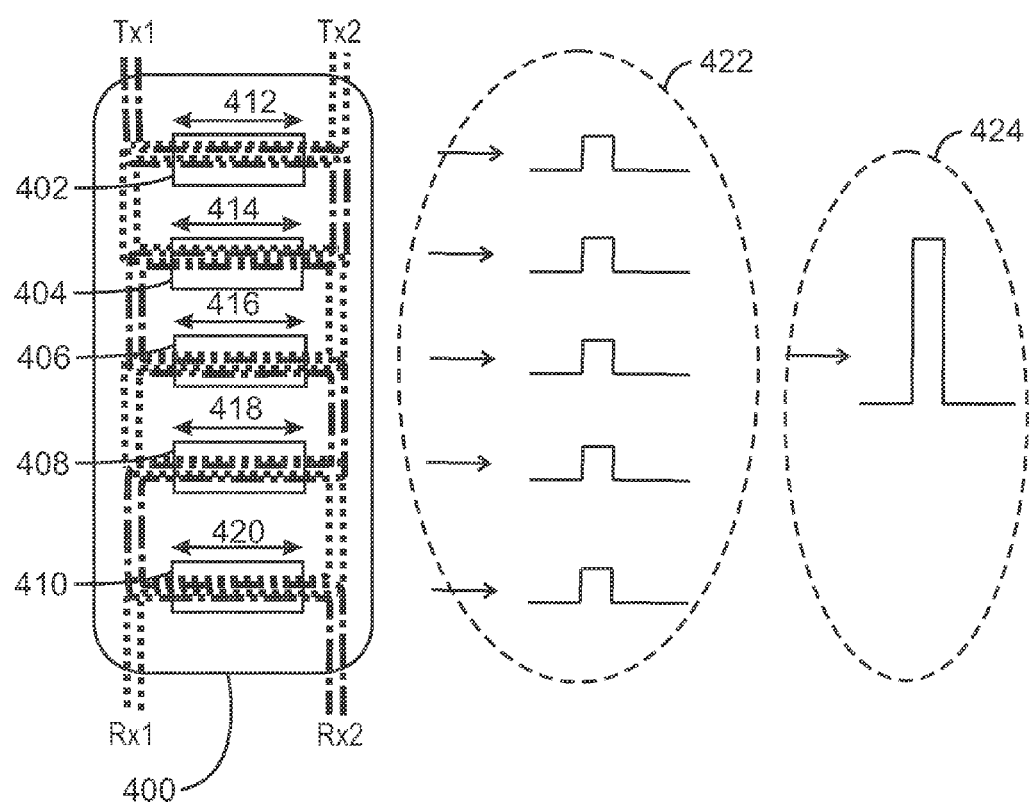
FIG. 4 is a plurality of regions to reduce global far end crosstalk in a circuit component.

FIG. 4 is a plurality of regions to reduce global far end crosstalk in a circuit component. In some embodiments, a circuit component 400 may include multiple regions 402, 404, 406, 408, and 410 to enable larger crosstalk introduction via an aggregate introduction of crosstalk. Since near end crosstalk is distributed in time, the effectiveness of the introduced local NEXT in terms of amplitude distributed in time is inversely proportional to the length indicated by the double arrows 412, 414, 416, 418, and 420 of the respective regions 402, 404, 406, 408, and 410. As illustrated in FIG. 4, each region 402, 404, 406, 408, and 410 may be associated with a given amplitude based on their respective lengths 412, 414, 416, 418, and 420 as indicated by the dashed circle 422. The aggregate amplitude, indicated by the dashed circle 424, illustrates an increased amplitude of local NEXT, relative to the individual amplitudes 422 of local NEXT, based on the multiple regions 402, 404, 406, 408, and 410 within the circuit component 400.

Figure 5:
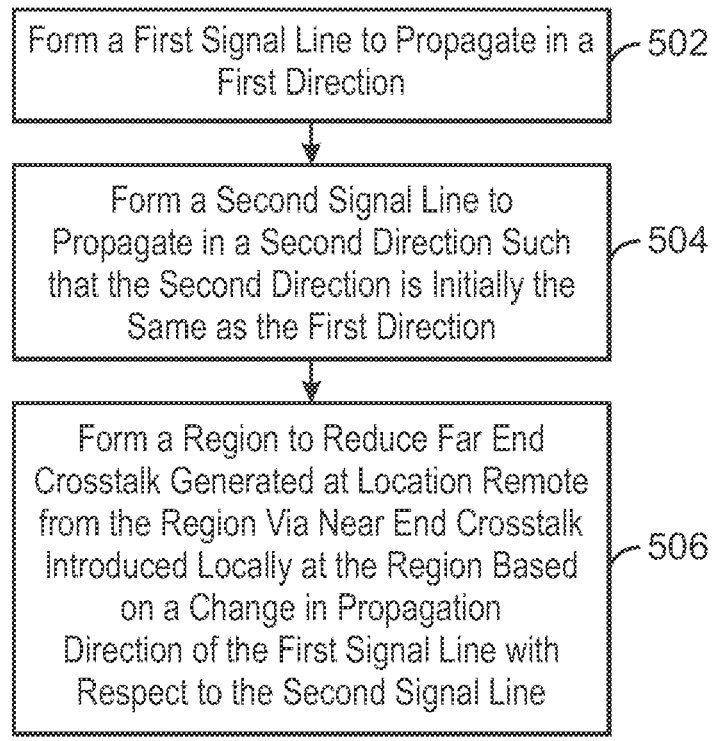
FIG. 5 is a block diagram illustrating a method of reducing crosstalk.

FIG. 5 is a block diagram illustrating a method of reducing crosstalk. The method 500 may include forming, at block 502, a first signal line to propagate in a first direction. The method 500 may include forming, at block 504, a second signal line to propagate in a second direction such that the second direction is initially the same as the first direction. The method 500 may include forming, at block 506, a region to reduce far end crosstalk generated at location remote from the region via near end crosstalk introduced locally at the region based on a change in propagation direction of the first signal line with respect to the second signal line.

As discussed above, the region formed by the method 500 may introduce a local NEXT to reduce global FEXT generated at a location remote from the region. The region introduces local NEXT to reduce the global FEXT via the opposite propagation direction of each of the signal lines within the region. However, the signal lines propagate in the same direction in at least some areas outside the region. In embodiments, the method 500 may include forming a transition in the first and second signal line such that the first and second signal line overlap, wherein the first propagation direction is to be opposite from the second propagation direction in the region due to the transitions.

As discussed above, the amplitude of the crosstalk introduced is inversely proportional to the size of the region. Therefore, in some embodiments, the method 500 may include forming a plurality of regions to reduce the remotely generated crosstalk.

In some embodiments, the method may include forming a reference plane between the first signal line and the second signal line. The reference plane may be used to define the region as an opening in the reference plane. The reference plane may be formed of a conductive material and may be used as a ground plane between signal lines.

EXAMPLE 1

A means for crosstalk reduction is described herein. In some embodiments, the means for crosstalk reduction may include a circuit component, an interconnect, or any combination thereof. The means for crosstalk reduction may include a first signal line to propagate in a first direction, and a second signal line to propagate a second direction. The means may include a region in the circuit component to introduce a crosstalk within the region that reduces another crosstalk generated at a location remote from the region based on a change in propagation direction of the first signal line and the second signal line. The means may include a transition in the first signal line and a transition in the second signal line such that the first and second signal lines overlap in the means for crosstalk reduction.

EXAMPLE 2

A circuit component is described herein. The circuit component includes a first signal line to propagate in a first direction, and a second signal line to propagate a second direction. The circuit component may include a region in the circuit component to introduce a crosstalk within the region that reduces another crosstalk generated at a location remote from the region based on a change in propagation direction of the first signal line and the second signal line.

EXAMPLE 3

A method of cross-talk reduction is described herein. The method includes forming a first signal line to propagate in a first direction, and forming a second signal line to propagate in a second direction such that the second direction is initially the same as the first direction. The method may also include forming a region to reduce far end crosstalk generated at location remote from the region via near end crosstalk introduced locally at the region based on a change in propagation direction of the first signal line with respect to the second signal line.

EXAMPLE 4

A circuit interconnect is described herein. The circuit interconnect includes a first signal line to propagate in a first direction, and a second signal line to propagate a second direction. The circuit interconnect includes a region to introduce a near end crosstalk within the region to reduce a far end crosstalk generated at a location remote from the region based on a change in propagation direction of the first signal line and the second signal line.

An embodiment is an implementation or example. Reference in the specification to "an embodiment," "one embodiment," "some embodiments," "various embodiments," or "other embodiments" means that a particular feature, structure, or characteristic described in connection with the embodiments is included in at least some embodiments, but not necessarily all embodiments, of the present techniques. The various appearances of "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

It is to be noted that, although some embodiments have been described in reference to particular implementations, other implementations are possible according to some embodiments. Additionally, the arrangement and/or order of circuit elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

It is to be understood that specifics in the aforementioned examples may be used anywhere in one or more embodiments. For instance, all optional features of the computing device described above may also be implemented with respect to either of the methods or the computer-readable medium described herein. Furthermore, although flow diagrams and/or state diagrams may have been used herein to describe embodiments, the techniques are not limited to those diagrams or to corresponding descriptions herein. For example, flow need not move through each illustrated box or state or in exactly the same order as illustrated and described herein.

The present techniques are not restricted to the particular details listed herein. Indeed, those skilled in the art having the benefit of this disclosure will appreciate that many other variations from the foregoing description and drawings may be made within the scope of the present techniques. Accordingly, it is the following claims including any amendments thereto that define the scope of the present techniques.

What is claimed is:

1. A circuit component, comprising:
 a first signal line to propagate in a first direction;
 a second signal line to propagate in a second direction; and
 a region in the circuit component to introduce a crosstalk within the region that reduces another crosstalk generated at a location remote from the region based on a change in propagation direction of the first signal line and the second signal line, wherein the first propagation direction is opposite from the second propagation direction in the region due to a transition in the first signal line and a transition in the second signal line.

2. The circuit component of claim 1, wherein the first and second signal lines overlap in the circuit component.

3. The circuit component of claim 1, wherein the first propagation direction is the same as the second propagation direction in locations remote from the region.

4. The circuit component of claim 1, wherein the crosstalk introduced within the region is near end crosstalk, and wherein the crosstalk introduced at the remote location is far end crosstalk.

5. The circuit component of claim 4, wherein the near end crosstalk introduced into the region is to reduce the far end crosstalk generated at the remote location.

6. The circuit component of claim 4, the circuit component comprising a plurality of regions to reduce the remotely generated crosstalk.

7. The circuit component of claim 1, comprising a reference plane between the first signal line and the second signal line, wherein the region is defined as an opening in the reference plane.

8. A method of cross-talk reduction, comprising:
 forming a first signal line to propagate in a first direction;
 forming a second signal line to propagate in a second direction such that the second direction is initially the same as the first direction; and
 forming a region to reduce far end crosstalk generated at location remote from the region via near end crosstalk introduced locally at the region based on a change in propagation direction of the first signal line with respect to the second signal line, wherein the first propagation direction is opposite from the second propagation direction in the region due to a transition in the first signal line and a transition in the second signal line.

9. The method of claim 8, comprising:
 forming a transition in the first signal line; and
 forming a transition in the second signal line such that the first and second signal lines overlap.

10. The method of claim 8, wherein the first propagation direction is to be the same as the second propagation direction in locations remote from the region.

11. The method of claim 8, the method comprising forming a plurality of regions to reduce the remotely generated crosstalk.

12. The method of claim 8, comprising forming a reference plane between the first signal line and the second signal line, wherein the region is defined as an opening in the reference plane.

13. A circuit interconnect, comprising:
   a first signal line to propagate in a first direction;
   a second signal line to propagate in a second direction; and
   a region in the circuit component to introduce a near end crosstalk within the region to reduce a far end crosstalk generated at a location remote from the region based on a change in propagation direction of the first signal line and the second signal line, wherein the first propagation direction is opposite from the second propagation direction in the region due to a transition in the first signal line and a transition in the second signal line.

14. The circuit interconnect of claim 13, comprising a transition in the first signal line and a transition in the second signal line such that the first and second signal lines overlap in the circuit component.

15. The circuit interconnect of claim 13, wherein the first propagation direction is the same as the second propagation direction in locations remote from the region.

16. The circuit interconnect of claim 13, wherein the amplitude of the crosstalk introduced is inversely proportional to the size of the region, the circuit interconnect comprising a plurality of regions to reduce the remotely generated crosstalk.

17. The circuit interconnect of claim 13, wherein the circuit interconnect is implemented as:
   an edge connector;
   a circuit package; or
   any combination of the above.

\* \* \* \* \*